United States Patent
Odnoblyudov et al.

(10) Patent No.: US 10,734,486 B2
(45) Date of Patent: *Aug. 4, 2020

(54) LATERAL HIGH ELECTRON MOBILITY TRANSISTOR WITH INTEGRATED CLAMP DIODE

(71) Applicant: QROMIS, Inc., Santa Clara, CA (US)

(72) Inventors: Vladimir Odnoblyudov, Danville, CA (US); Ozgur Aktas, Pleasanton, CA (US)

(73) Assignee: Qromis, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/600,041

(22) Filed: Oct. 11, 2019

(65) Prior Publication Data

US 2020/0044033 A1     Feb. 6, 2020

Related U.S. Application Data

(62) Division of application No. 15/831,954, filed on Dec. 5, 2017, now Pat. No. 10,490,636.

(Continued)

(51) Int. Cl.
*H01L 29/20* (2006.01)
*H01L 29/66* (2006.01)
(Continued)

(52) U.S. Cl.
CPC ........ *H01L 29/2003* (2013.01); *H01L 29/404* (2013.01); *H01L 29/41766* (2013.01);
(Continued)

(58) Field of Classification Search
CPC ........... H01L 29/2003; H01L 29/66462; H01L 29/7789; H01L 29/7821; H01L 29/7824
(Continued)

(56) References Cited

U.S. PATENT DOCUMENTS 6,533,874 B1   3/2003   Vaudo et al.
8,076,699 B2   12/2011  Chen et al.
(Continued)

OTHER PUBLICATIONS

International Search Report and Written Opinion of the International Searching Authority in related International Application PCT/US17/64726 dated Mar. 7, 2018 (eight pages)
(Continued)

*Primary Examiner* — Tong-Ho Kim
(74) *Attorney, Agent, or Firm* — Kilpatrick Townsend & Stockton LLP

(57) ABSTRACT

A method of forming a semiconductor device includes providing an engineered substrate, forming a gallium nitride layer coupled to the engineered substrate, forming a channel region coupled to the gallium nitride layer by forming an aluminum gallium nitride barrier layer on the front surface of the gallium nitride layer, forming a gate dielectric layer coupled to the aluminum gallium nitride barrier layer in the central portion of the channel region, forming a gate contact coupled to the gate dielectric layer, forming a source contact at the first end of the channel region, forming a via at the second end of the channel region, filling the via with a conductive material, forming a drain contact coupled to the via, removing the engineered substrate to expose the back surface of the epitaxial gallium nitride layer, and forming a drain pad on the back surface of the epitaxial gallium nitride layer.

11 Claims, 7 Drawing Sheets

Related U.S. Application Data

(60) Provisional application No. 62/430,649, filed on Dec. 6, 2016.

(51) Int. Cl.

| | | |
|---|---|---|
| *H01L 29/78* | (2006.01) | |
| *H01L 29/40* | (2006.01) | |
| *H01L 29/417* | (2006.01) | |
| *H01L 29/778* | (2006.01) | |
| *H01L 29/423* | (2006.01) | |

(52) U.S. Cl.
CPC .... *H01L 29/66462* (2013.01); *H01L 29/7786* (2013.01); *H01L 29/7789* (2013.01); *H01L 29/7821* (2013.01); *H01L 29/7824* (2013.01); *H01L 29/42376* (2013.01)

(58) Field of Classification Search
USPC .......................................................... 257/76
See application file for complete search history.

(56) References Cited

U.S. PATENT DOCUMENTS

| | | | |
|---|---|---|---|
| 2013/0092958 A1* | 4/2013 | Chen | H01L 29/2003 257/77 |
| 2014/0183442 A1* | 7/2014 | Odnoblyudov | H01L 33/24 257/13 |
| 2015/0221757 A1* | 8/2015 | Nakayama | H01L 29/861 257/20 |
| 2015/0311330 A1 | 10/2015 | Li et al. | |
| 2016/0005816 A1 | 1/2016 | Kim et al. | |
| 2016/0005845 A1 | 1/2016 | Kim et al. | |
| 2018/0038012 A1* | 2/2018 | Odnoblyudov | H01L 21/02458 |

OTHER PUBLICATIONS

Han Sang-Woo, et al., "Normally-Off Operation of AlGaN/GaN Heterojunction Field-Effect Transistor with Clamping Diode," Journal of Semiconductor Technology and Science, vol. 16, No. 2, pp. 221-225 (Apr. 2016).

Non-Final Office Action dated Oct. 18, 2018 in related U.S. Appl. No. 15/831,954 (sixteen pages).

\* cited by examiner

LATERAL HIGH ELECTRON MOBILITY TRANSISTOR WITH INTEGRATED CLAMP DIODE

CROSS-REFERENCES TO RELATED APPLICATIONS

This application is a divisional application of U.S. patent application Ser. No. 15/831,954, filed on Dec. 5, 2017, now U.S. Pat. No. 10,490,636, which claims priority to U.S. Provisional Patent Application No. 62/430,649, filed on Dec. 6, 2016, the contents of which are hereby incorporated by reference in its entirety for all purposes.

BACKGROUND OF THE INVENTION

Gallium nitride based power devices are typically epitaxially grown on sapphire substrates. The growth of gallium nitride based power devices on a sapphire substrate is a heteroepitaxial growth process since the substrate and the epitaxial layers are composed of different materials. Due to the heteroepitaxial growth process, the epitaxially grown material can exhibit a variety of adverse effects, including reduced uniformity and reductions in metrics associated with the electronic/optical properties of the epitaxial layers. Accordingly, there is a need in the art for improved methods and systems related to epitaxial growth processes and substrate structures.

SUMMARY OF THE INVENTION

The present invention relates generally to lateral high electron mobility transistors (HEMTs). More specifically, the present invention relates to systems and methods for forming HEMTs with integrated n-i-n, n-i-p, or n-p type clamp diodes. Merely by way of example, the invention has been applied to systems and methods for forming HEMTs with integrated n-i-n type clamp diodes utilizing a ceramic substrate. The methods and techniques can be applied to a variety of semiconductor processing operations.

According to an embodiment of the present invention, a method of forming a semiconductor device includes providing an engineered substrate. The engineered substrate includes a polycrystalline ceramic core, a barrier layer encapsulating the polycrystalline ceramic core, a bonding layer coupled to the barrier layer, and a substantially single crystalline silicon layer coupled to the bonding layer. The method further includes forming an epitaxial gallium nitride layer coupled to the substantially single crystalline silicon layer. The epitaxial gallium nitride layer has a back surface and a front surface. The method further includes forming a channel region coupled to the epitaxial gallium nitride layer by forming an epitaxial aluminum gallium nitride barrier layer on the front surface of the epitaxial gallium nitride layer. The channel region has a first end and a second end, and a central portion between the first end and the second end. The method further includes forming a gate dielectric layer coupled to the epitaxial aluminum gallium nitride barrier layer in the central portion of the channel region, forming a gate contact coupled to the gate dielectric layer, forming a source contact at the first end of the channel region, and forming a via at the second end of the channel region. The via runs through the epitaxial aluminum gallium nitride barrier layer and the epitaxial gallium nitride layer. The method further includes filling the via with a conductive material, forming a drain contact coupled to the via, removing the engineered substrate to expose the back surface of the epitaxial gallium nitride layer, and forming a drain pad on the back surface of the epitaxial gallium nitride layer. The drain pad is electrically coupled to the drain contact through the conductive material in the via.

According to another embodiment of the present invention, a method of forming a semiconductor device includes providing an engineered substrate. The engineered substrate includes a polycrystalline ceramic core, a barrier layer encapsulating the polycrystalline ceramic core, a bonding layer coupled to the barrier layer, and a substantially single crystalline silicon layer coupled to the bonding layer. The method further includes forming a first epitaxial N-type gallium nitride layer coupled to the substantially single crystalline silicon layer. The first epitaxial N-type gallium nitride layer has a first doping concentration. The method further includes forming a second epitaxial N-type gallium nitride layer coupled to the first epitaxial N-type gallium nitride layer. The second epitaxial N-type gallium nitride layer has a second doping concentration less than the first doping concentration. The method further includes forming a channel region coupled to the second epitaxial N-type gallium nitride layer by forming an epitaxial aluminum gallium nitride barrier layer on the second epitaxial N-type gallium nitride layer. The channel region has a first end and a second end, and a central portion between the first end and the second end. The method further includes forming a gate dielectric layer coupled to the epitaxial aluminum gallium nitride barrier layer in the central portion of the channel region, forming a gate contact coupled to the gate dielectric layer, forming a source contact at the first end of the channel region, forming a via through the second epitaxial N-type gallium nitride layer at the second end of the channel region to expose a portion of the first epitaxial N-type gallium nitride layer, filling the via with a conductive material, and forming a drain contact at the second end of the channel region. The drain contact is electrically coupled to the first epitaxial N-type gallium nitride layer through the conductive material in the via.

According to a further embodiment of the present invention, a lateral high-electron-mobility transistor (HEMT) includes a drain pad, an epitaxial gallium nitride layer coupled to the drain contact, a channel region having a first end, a second end, and a central portion between the first end and the second end. The channel region includes an epitaxial aluminum gallium nitride barrier layer coupled to the epitaxial gallium nitride layer. The lateral high-electron-mobility transistor (HEMT) further includes a gate dielectric layer coupled to the central portion of the channel region, a gate contact coupled to the gate dielectric layer, a source contact disposed at the first end of the channel region, a via disposed at the second end of the channel region, and a drain contact coupled to the via. The drain pad is electrically connected to the drain contact through the via.

These and other embodiments of the invention along with many of its advantages and features are described in more detail in conjunction with the text below and attached figures.

DETAILED DESCRIPTION OF SPECIFIC EMBODIMENTS

The present invention relates generally to high electron mobility transistors (HEMTs) formed on engineered substrates. More specifically, the present invention relates to methods and systems suitable for fabricating lateral HEMTs with integrated voltage clamp using epitaxial growth processes. Merely by way of example, the invention has been applied to a method and system for fabricating lateral HEMTs on a substrate by epitaxial growth, wherein the substrate is characterized by a coefficient of thermal expansion (CTE) that is substantially matched to epitaxial layers that form the lateral HEMTs. The methods and techniques can be applied to a variety of semiconductor processing operations.

Figure 1:
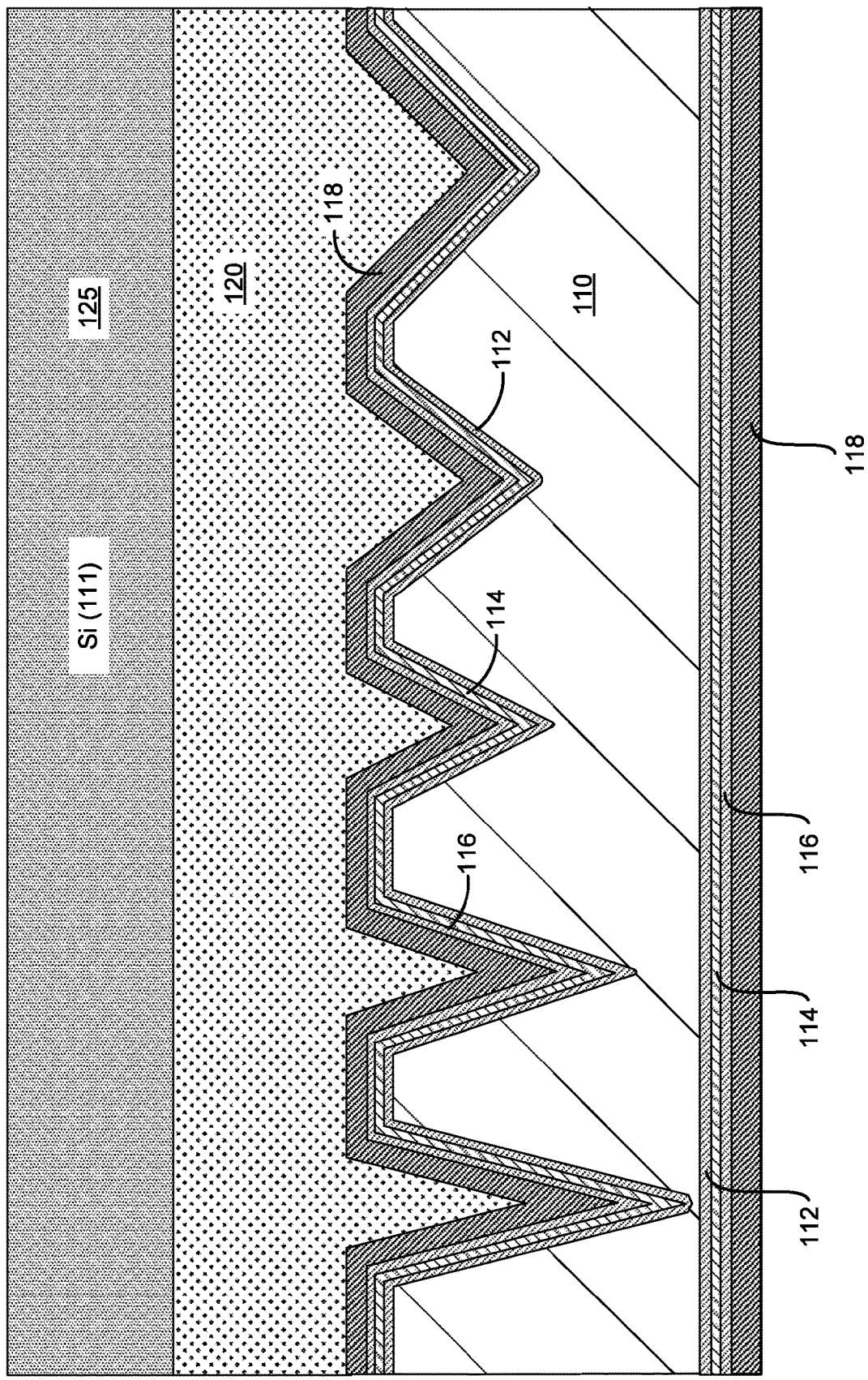
FIG. 1 is a simplified schematic cross-sectional diagram illustrating an engineered substrate structure according to some embodiments of the present invention.

FIG. 1 is a simplified schematic diagram illustrating an engineered substrate structure according to an embodiment of the present invention. As illustrated in FIG. 1, the engineered substrate structure may be suitable for a variety of electronic and optical applications. The engineered substrate structure includes a core 110 (e.g., AlN substrate) that can have a coefficient of thermal expansion (CTE) that is substantially matched to the CTE of the epitaxial material that will be grown on the engineered substrate structure, for example, on the exfoliated silicon (111) layer 125.

For applications including the growth of gallium nitride (GaN)-based materials (epitaxial layers including GaN-based layers), the core 110 can be a polycrystalline ceramic material, for example, polycrystalline aluminum nitride (AlN), which can include a binding material such as yttrium oxide. Other materials can be utilized in the core, including polycrystalline gallium nitride (GaN), polycrystalline aluminum gallium nitride (AlGaN), polycrystalline silicon carbide (SiC), polycrystalline zinc oxide (ZnO), polycrystalline gallium trioxide ($Ga_2O_3$), and the like.

The thickness of the core 110 can be on the order of 100 to 1,500 μm, for example, 750 μm. The core 110 is encapsulated in an adhesion layer 112 that can be referred to as a shell or an encapsulating shell. In an embodiment, the adhesion layer 112 comprises a tetraethyl orthosilicate (TEOS) oxide layer on the order of 1,000 Å in thickness. In other embodiments, the thickness of the adhesion layer 112 varies, for example, from 100 Å to 2,000 Å. Although TEOS oxides are utilized for adhesion layers 112 in some embodiments, other materials that provide for adhesion between later deposited layers and underlying layers or materials (e.g., ceramics, in particular, polycrystalline ceramics) can be utilized according to an embodiment of the present invention. For example, $SiO_2$ or other silicon oxides ($SiO_y$) adhere well to ceramic materials and provide a suitable surface for subsequent deposition, for example, of conductive materials. The adhesion layer 112 completely surrounds the core 110 in some embodiments to form a fully encapsulated core 110 and can be formed using an LPCVD process or other suitable deposition processes, which can be compatible with semiconductor processing and in particular with polycrystalline or composite substrates and layers. The adhesion layer 112 provides a surface on which subsequent layers adhere to form elements of the engineered substrate structure.

In addition to the use of LPCVD processes, spin on glass/dielectrics, furnace-based processes, and the like to form the encapsulating adhesion layer, other semiconductor processes can be utilized according to embodiments of the present invention, including CVD processes or similar deposition processes. As an example, a deposition process that coats a portion of the core 110 can be utilized, the core 110 can be flipped over, and the deposition process could be repeated to coat additional portions of the core 110. Thus, although LPCVD techniques are utilized in some embodiments to provide a fully encapsulated structure, other film formation techniques can be utilized depending on the particular application.

A conductive layer 114 is formed surrounding the adhesion layer 112. In an embodiment, the conductive layer 114 is a shell of polysilicon (i.e., polycrystalline silicon) that is formed surrounding the adhesion layer 112 since polysilicon can exhibit poor adhesion to ceramic materials. In embodiments in which the conductive layer 114 is polysilicon, the thickness of the polysilicon layer can be on the order of 500-5,000 Å, for example, 2,500 Å. In some embodiments, the polysilicon layer can be formed as a shell to completely surround the adhesion layer 112 (e.g., a TEOS oxide layer), thereby forming a fully encapsulated adhesion layer 112, and can be formed using an LPCVD process. In other embodiments, as discussed below, the conductive material can be formed on a portion of the adhesion layer 112, for example, a lower half of the substrate structure. In some embodiments, conductive material can be formed as a fully encapsulating layer and subsequently removed on one side of the substrate structure.

In an embodiment, the conductive layer 114 can be a polysilicon layer doped to provide a highly conductive material, for example, doped with boron to provide a p-type polysilicon layer. In some embodiments, the doping with boron is at a level of $1 \times 10^{19}$ cm$^{-3}$ to $1 \times 10^{20}$ cm$^{-3}$ to provide for high conductivity. Other dopants at different dopant concentrations (e.g., phosphorus, arsenic, bismuth, or the like at dopant concentrations ranging from $1 \times 10^{16}$ cm$^{-3}$ to $5 \times 10^{18}$ cm$^{-3}$) can be utilized to provide either n-type or p-type semiconductor materials suitable for use in the conductive layer 114. One of ordinary skill in the art would recognize many variations, modifications, and alternatives.

The presence of the conductive layer 114 is useful during electrostatic chucking of the engineered substrate to semiconductor processing tools, for example tools with electrostatic chucks (ESC or e-chuck). The conductive layer enables rapid dechucking after processing in the semiconductor processing tools. In embodiments of the present invention, the conductive layer 114 enables electrical contact with the chuck or capacitive coupling to the e-chuck during future processing including bonding. Thus, embodiments of the present invention provide substrate structures that can be processed in manners utilized with conventional silicon wafers. One of ordinary skill in the art would recognize many variations, modifications, and alternatives. Additionally, having a substrate structure with high thermal conductivity in combination with the electrostatic chucking may afford better deposition conditions for the subsequent formation of engineered layers and epitaxial layers, as well as for the subsequent device fabrication steps. For example, it may provide desirable thermal profiles that can result in lower stress, more uniform deposition thicknesses, and better stoichiometry control through the subsequent layer formations.

A second adhesion layer 116 (e.g., a TEOS oxide layer on the order of 1,000 Å in thickness) is formed surrounding the conductive layer 114. The second adhesion layer 116 completely surrounds the conductive layer 114 in some embodiments to form a fully encapsulated structure and can be formed using an LPCVD process, a CVD process, or any other suitable deposition process, including the deposition of a spin-on dielectric.

A barrier layer 118, for example, a silicon nitride layer, is formed surrounding the second adhesion layer 116. In an embodiment, the barrier layer 118 is a silicon nitride layer that is on the order of 2,000 Å to 5,000 Å in thickness. The barrier layer 118 completely surrounds the second adhesion layer 116 in some embodiments to form a fully encapsulated structure and can be formed using an LPCVD process. In addition to silicon nitride layers, amorphous materials including SiCN, SiON, AlN, SiC, and the like can be utilized as barrier layers 118. In some implementations, the barrier layer 118 consists of a number of sub-layers that are built up to form the barrier layer 118. Thus, the term barrier layer is not intended to denote a single layer or a single material, but to encompass one or more materials layered in a composite manner. One of ordinary skill in the art would recognize many variations, modifications, and alternatives.

In some embodiments, the barrier layer 118, e.g., a silicon nitride layer, prevents diffusion and/or outgassing of elements present in the core, for example, yttrium (elemental), yttrium oxide (i.e., yttria), oxygen, metallic impurities, other trace elements, and the like into the environment of the semiconductor processing chambers in which the engineered substrate could be present, for example, during a high temperature (e.g., 1,000° C.) epitaxial growth process. Utilizing the encapsulating layers described herein, ceramic materials, including polycrystalline AlN that are designed for non-clean room environments, can be utilized in semiconductor process flows and clean room environments.

Typically, ceramic materials utilized to form the core are fired at temperatures in the range of 1,800° C. It would be expected that this process would drive out a significant amount of impurities present in the ceramic materials. These impurities can include yttrium, which results from the use of yttria as sintering agent, calcium, and other elements and compounds. Subsequently, during epitaxial growth processes, which are conducted at much lower temperatures in the range of 800° C. to 1,100° C., it would be expected that the subsequent diffusion of these impurities would be insignificant. However, contrary to conventional expectations, the inventors have determined that even during epitaxial growth processes at temperatures much less than the firing temperature of the ceramic materials, significant diffusion of elements through the layers of the engineered substrate was present. Thus, embodiments of the present invention integrate the barrier layer 118 into the engineered substrate structure to prevent this undesirable diffusion.

Referring once again to FIG. 1, a bonding layer 120 (e.g., a silicon oxide layer) is deposited on a portion of the barrier layer 118, for example, the top surface of the barrier layer 118, and subsequently used during the bonding of a substantially single crystal layer 125 (e.g., a single crystal silicon layer such as the exfoliated silicon (111) layer illustrated in FIG. 1). The bonding layer 120 can be approximately 1.5 µm in thickness in some embodiments. In some embodiments, the thickness of the bonding layer 120 is 20 nm or more for bond-induced void mitigation. In some embodiments, the thickness of the bonding layer 120 is in the range of 0.75-1.5 µm.

The substantially single crystal layer 125 (e.g., exfoliated Si (111)) is suitable for use as a growth layer during an epitaxial growth process for the formation of epitaxial materials. In some embodiments, the epitaxial material can include a GaN layer 2 µm to 10 µm in thickness, which can be utilized as one of a plurality of layers utilized in optoelectronic, RF, and power devices. In an embodiment, the substantially single crystal layer 125 includes a single crystal silicon layer that is attached to the bonding layer 120 using a layer transfer process.

Additional description related to the engineered substrate structure is provided in U.S. patent application Ser. No. 15/621,335, filed on Jun. 13, 2017, and U.S. patent application Ser. No. 15/621,235, filed on Jun. 13, 2017, the disclosures of which are hereby incorporated by reference in their entirety for all purposes.

Figure 2:
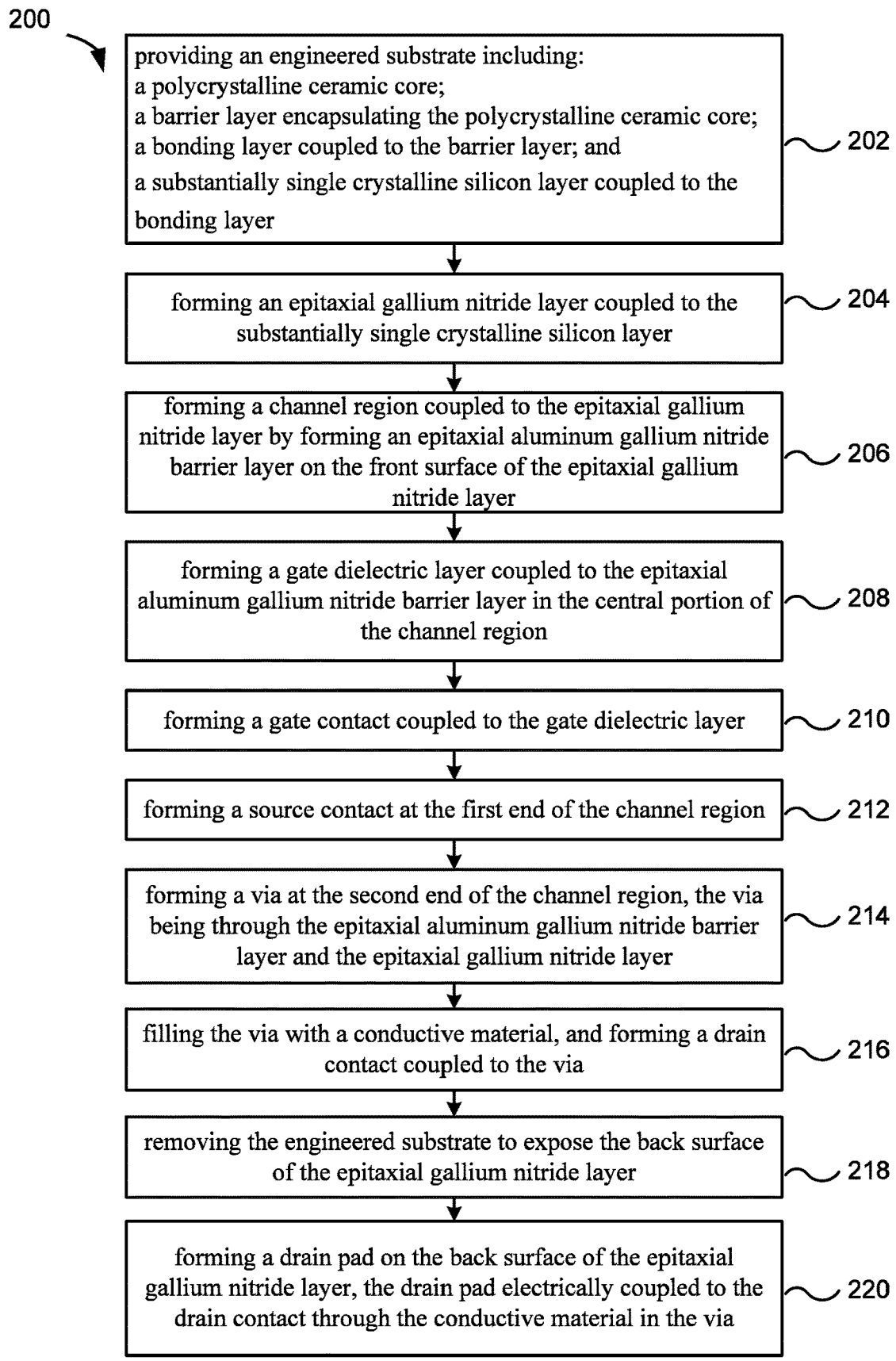
FIG. 2 shows a simplified flowchart illustrating a method of forming a lateral high electron mobility transistor (HEMT) according to some embodiments of the present invention.
Figure 3A:
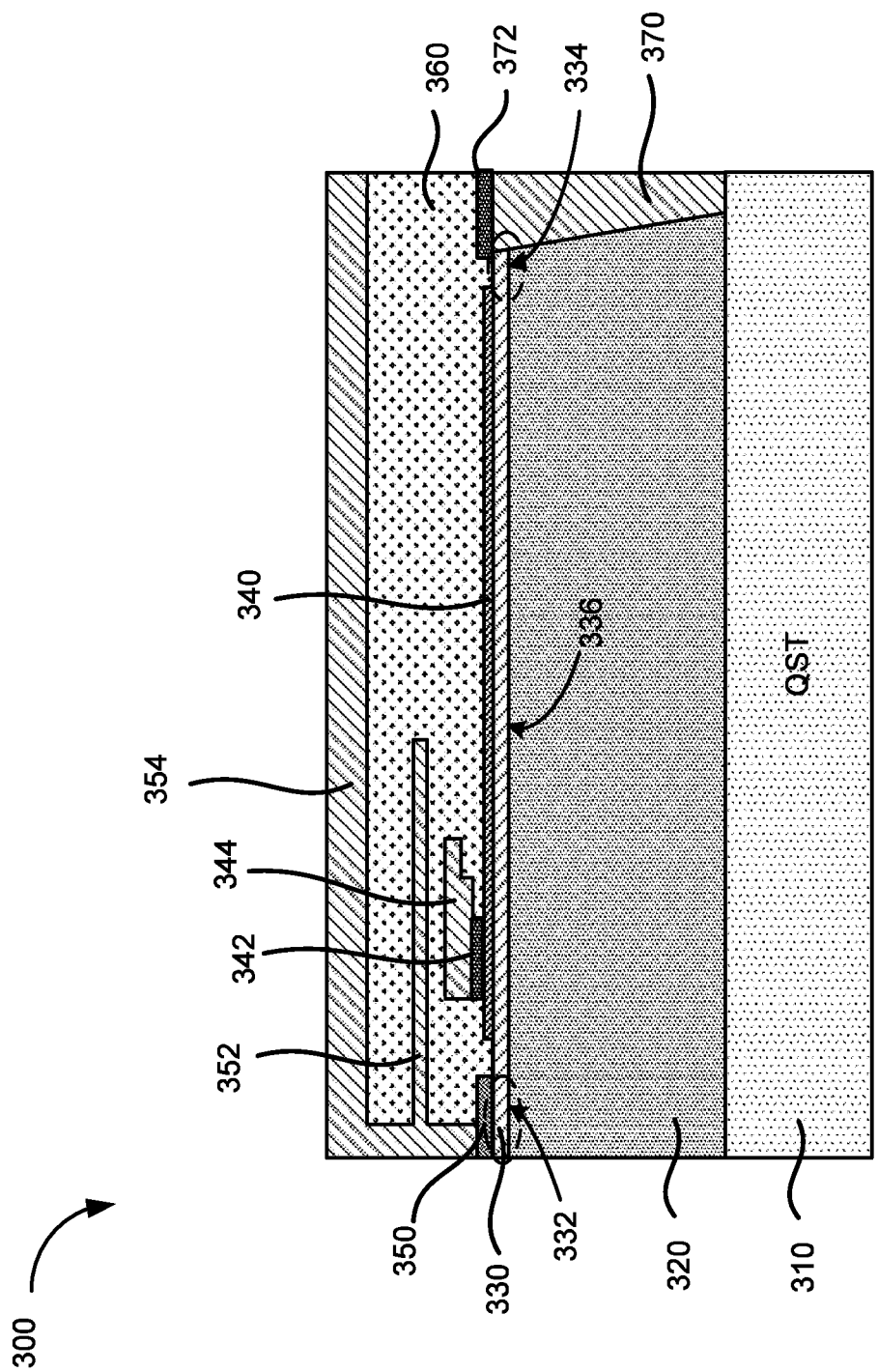
FIGS. 3A and 3B show schematic cross-sectional diagrams illustrating a lateral HEMT according to some embodiments of the present invention.
Figure 3B:
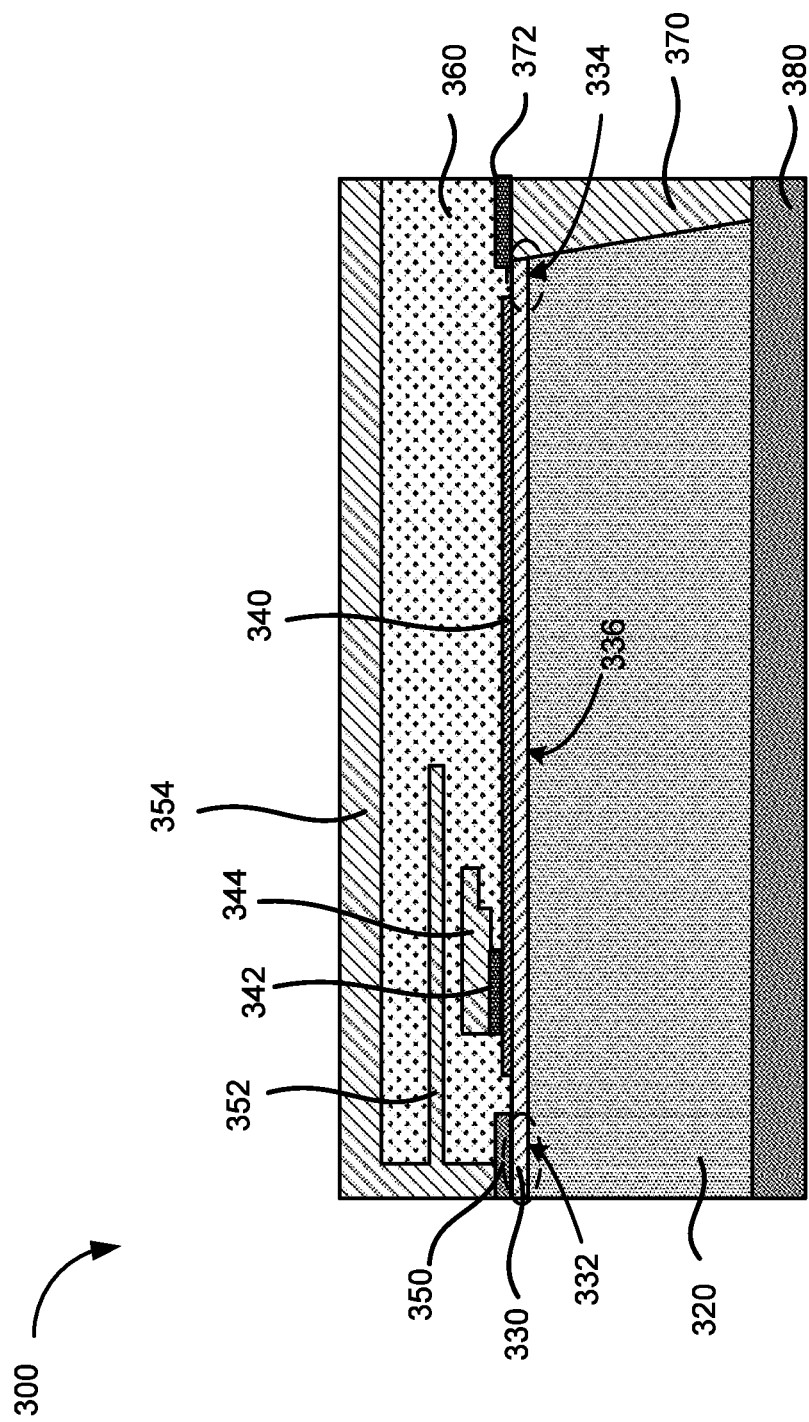

FIG. 2 shows a simplified flowchart illustrating a method 200 of forming a lateral high electron mobility transistor (HEMT) 300 according to an embodiment of the present invention. FIGS. 3A-3B show schematic cross-sectional diagrams illustrating a lateral HEMT 300 according to some embodiments of the present invention.

Referring to FIGS. 2 and 3A, the method 200 includes, at 202, providing an engineered substrate 310. According to some embodiments, the engineered substrate 310 may include a polycrystalline ceramic core, a barrier layer encapsulating the polycrystalline ceramic core, a bonding layer coupled to the barrier layer, and a substantially single crystalline silicon layer coupled to the bonding layer, as discussed above with reference to FIG. 1.

In some embodiments, the polycrystalline ceramic core of the engineered substrate 310 may include polycrystalline aluminum gallium nitride (AlGaN), polycrystalline gallium nitride (GaN), polycrystalline aluminum nitride (AlN), polycrystalline silicon carbide (SiC), or a combination thereof. In some embodiments, the barrier layer may include $SiO_y$, $Si_xN_y$, $Si_xO_yN_z$, SiCN, SiON, AlN, SiC, or a combination thereof. In some embodiments, the bonding layer may include an oxide layer, such as a silicon oxide layer. In one embodiment, the single crystal silicon layer includes a silicon (111) layer that may be suitable for use as a growth layer during epitaxial growth process for the formation of epitaxial materials as discussed below.

In some embodiments, as discussed above with reference to FIG. 1, the engineered substrate 310 may further include a first adhesion layer coupled to the polycrystalline ceramic core, a conductive layer coupled to the first adhesion layer, and a second adhesion layer coupled to the conductive layer, where the first adhesion layer, the conductive layer and the second adhesion layer are disposed between the polycrystalline ceramic core and the barrier layer. In some embodiments, the first adhesion layer may comprise a first tetraethyl orthosilicate (TEOS) oxide layer, and the second adhesion layer may comprise a second TEOS oxide layer. The conductive layer may comprise a polysilicon layer. In some embodiments, the engineered substrate 310 may further include a nucleation layer coupled to the substantially single crystalline silicon layer for facilitating the formation of the epitaxial device layers.

Still referring to FIGS. 2 and 3A, the method 200 further includes, at 204, at 204, forming an epitaxial gallium nitride layer 320 coupled to the substantially single crystalline silicon layer. The epitaxial gallium nitride layer 320 has a back surface and a front surface. The back surface is coupled to the engineered substrate 310. The epitaxial gallium nitride layer 320 may serve as a blocking layer and preferably have a relatively low doping concentration, for example in the order of about $1\times10^{15}$ cm$^{-3}$. By using a CTE-matched engineered substrate, epitaxial growth of a relatively thick blocking GaN layer with low dislocation density may be possible. In some embodiments, the epitaxial gallium nitride layer 320 may have a thickness that is greater than about 5 μm. In some other embodiments, the epitaxial gallium nitride layer 320 may have a thickness that is greater than about 10 μm.

The method 200 further includes, at 206, forming an epitaxial aluminum gallium nitride barrier layer 330 coupled to the front surface of the epitaxial gallium nitride layer 320. The epitaxial aluminum gallium nitride barrier layer 330 may serve as the channel region of the HEMT 300. The channel region has a first end 332 and a second end 334, and a central portion 336 between the first end 332 and the second end 334. In one embodiment, the epitaxial aluminum gallium nitride barrier layer 330 may include about 20% aluminum. The interface between the epitaxial gallium nitride layer 320 and the epitaxial aluminum gallium nitride barrier layer 330 (referred to as the AlGaN/GaN interface) may result in a two-dimensional electron gas (2DEG) due to polarization induced charge at the hetero-interface.

According to some embodiments, the epitaxial gallium nitride layer 320 and the epitaxial aluminum gallium nitride barrier layer 330 may be formed by thin film deposition techniques such as chemical vapor deposition CVD (including metal-organic CVD (MOCVD), low-pressure CVD (LP-CVD), plasma-enhanced CVD (PECVD), atomic-layer CVD (ALCVD)), hydride vapor phase epitaxy (HYPE), atomic layer deposition (ALD), molecular beam epitaxy (MBE), or a combination thereof.

Still referring to FIGS. 2 and 3A, the method 200 further includes, at 208, forming a gate dielectric layer 340 coupled to the epitaxial aluminum gallium nitride barrier layer 330 in the central portion 336 of the channel region, and at 210, forming a gate contact 342 coupled to the gate dielectric layer 340. The method 200 may further include forming one or more gate field plates (FPs) 344 coupled to the gate contact 342. The method 200 further includes, at 212, forming a source contact 350 at the first end 332 of the channel region. The method 200 may further include forming a source field plate (FP) 352 coupled to the source contact 350. The gate FP 344 and the source FP 352 may be fabricated from low-doped amorphous or polycrystalline silicon deposited by a suitable deposition non-epitaxial method.

The method 200 may further include forming an interlayer dielectric layer (ILD) 360 over the device structure. The ILD 360 may comprise, for example, SiN$_x$. In some embodiments, the ILD 360 may have a thickness of about 50 μm. The method 200 may further include forming a source pad 354 coupled to the source contact 350 and the source FP 352 over the ILD 360. The method 200 may further include forming an off-plane gate pad (not shown in FIG. 3A).

Referring to FIGS. 2 and 3A, the method 200 further includes, at 214, forming a via 370 at the second end 334 of the channel region. The via 370 may run through the epitaxial aluminum gallium nitride barrier layer 330 and the epitaxial gallium nitride layer 320. The method 200 further includes, at 216, filling the via 370 with a conductive material, and forming a drain contact 372 coupled to the via 370.

A via may be defined as a vertical and high aspect ratio cavity that is generally dry etched into a substrate using deep reactive etching. Filling of a via may involve several steps. First, a dielectric liner may be formed in the via. The dielectric liner may prevent electrical conduction to the substrate. After the liner deposition, a diffusion barrier (barrier) layer may be deposited to prevent the conductive via material from migrating out of the trench and into the substrate. Then a seed layer and/or an adhesion layer may be deposited over the dielectric liner and the diffusion barrier layer. The seed layer and the adhesion layer may be the same or different layer materials. The seed layer and the adhesion layer may serve the purpose of allowing for a well adhered nucleation layer for the subsequent plating or electrodeposition of a metal into the via. Given the high aspect ratio of the via (e.g., about 10:1 up to 50:1), the dielectric liner, barrier layer, adhesion layer and seed layer can be relatively thin (e.g., a few nanometers). The plated or electrodeposited via material may be Cu, W, or similar conductive material that fills the via and provides for the electrical connectivity through the substrate.

Referring to FIGS. 2, 3A, and 3B, the method 200 further includes, at 218, removing the engineered substrate 310 to expose the back surface of the epitaxial gallium nitride layer 320.

The engineered substrate 310 may be removed, for example, by mechanical polishing, dry etch, wet etch, or a liftoff process using an etching chemical such as hydrofluoric acid (HF) or sulfuric acid (H$_2$SO$_4$). The removal of the engineered substrate 310 creates a large area of a freestanding GaN. Because the epitaxial gallium nitride layer 320 is formed on substantially CTE-matched engineered substrate 310, the epitaxial gallium nitride layer 320 may not warp or bow under stress after the engineered substrate 310 is removed. The method 200 may further include, after the engineered substrate 310 is removed, performing etching to remove damaged portion of the epitaxial gallium nitride layer 320 to reduce contact resistance.

Referring to FIGS. 2 and 3B, the method 200 further includes, at 220, forming a drain pad 380 on the back surface of the epitaxial gallium nitride layer 320. The drain pad 380 is electrically coupled to the drain contact 372 through the conductive material in the via 370.

Thus, in the manner described above, the drain pad 380 is positioned at the back side of the HEMT 300, instead of the front side. This device configuration may afford several advantages. For example, it may reduce the areal dimension of the device as well as improving area utilization efficiency. It may also simplify the metallization processes and the formation of the dielectric stack.

In addition, the epitaxial aluminum gallium nitride barrier layer 330 and the epitaxial gallium nitride layer 320 may serve as an integrated n-i-n type clamp diode. The clamp diode may be designed to break down at a voltage less than the breakdown voltage of the HEMT 300, thus protecting the HEMT 300 from damage. In some embodiments, the clamp diode may be configured to have a breakdown voltage of about 600 V. The lack of holes during the breakdown of the n-i-n type clamp diode may prevent hole injection into the gate dielectric, thereby removing one of the major reliability failure mechanisms.

Figure 3C:
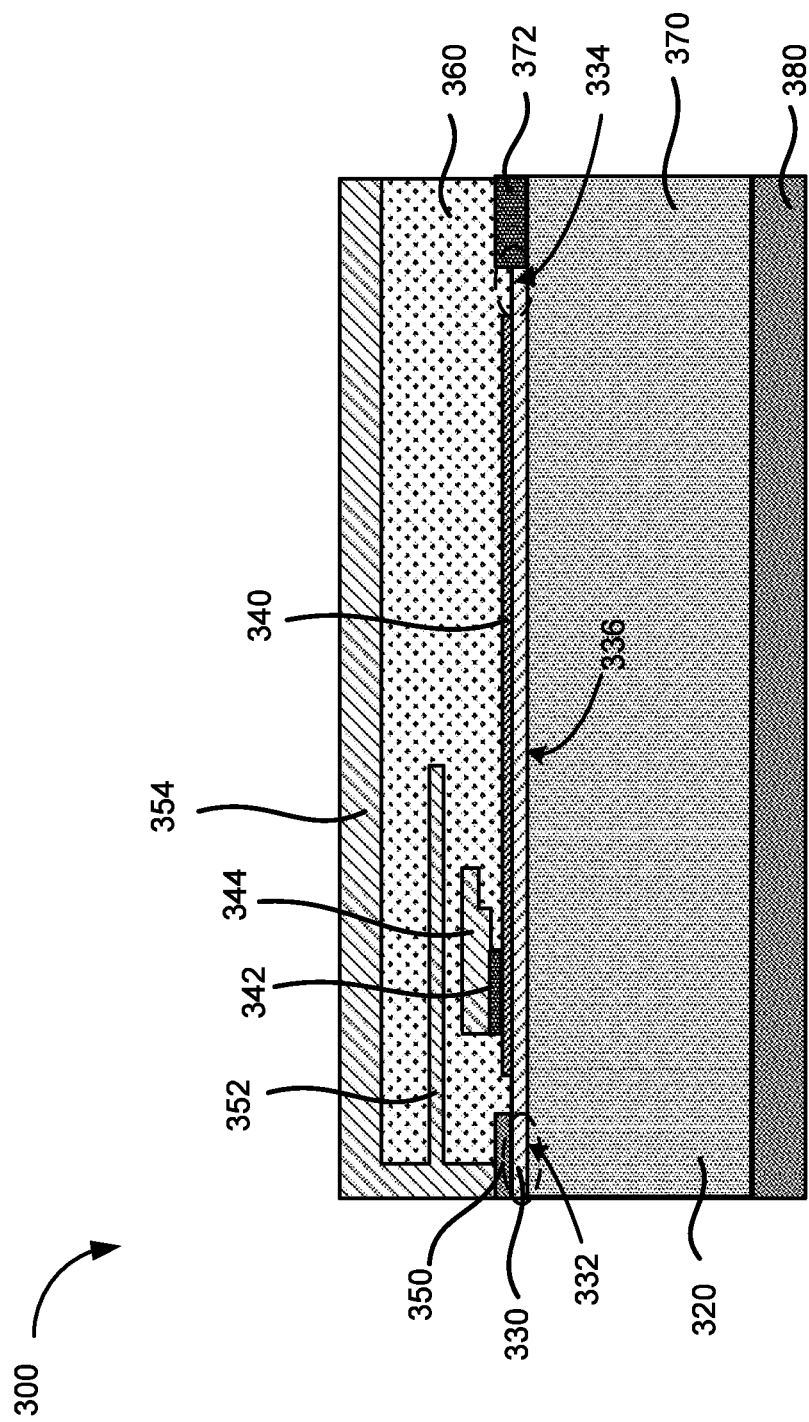
FIG. 3C shows a schematic cross-sectional diagram illustrating a lateral HEMT according to some other embodiments of the present invention.

FIG. 3C illustrates an alternative embodiment where the via 370 is omitted. In this embodiment, the drain pad 380 may be electrically coupled to the drain contact 372 through an external connection.

It should be appreciated that the specific steps illustrated in FIG. 2 provide a particular method of 200 according to an embodiment of the present invention. Other sequences of steps may also be performed according to alternative embodiments. For example, alternative embodiments of the present invention may perform the steps outlined above in a different order. Moreover, the individual steps illustrated in FIG. 2 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 4:
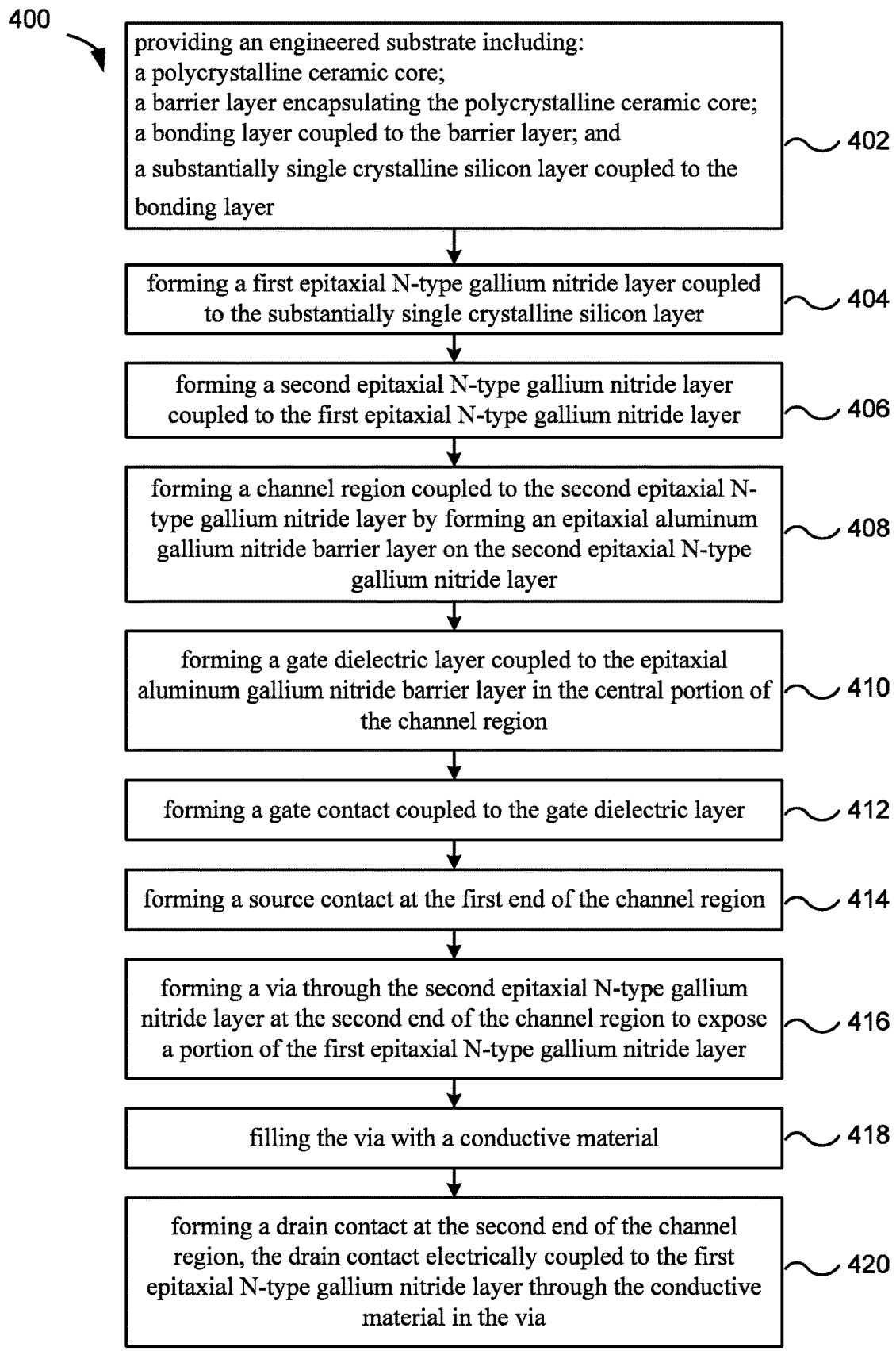
FIG. 4 shows a simplified flowchart illustrating a method of forming a lateral high electron mobility transistors (HEMT) according to some other embodiments of the present invention.
Figure 5:
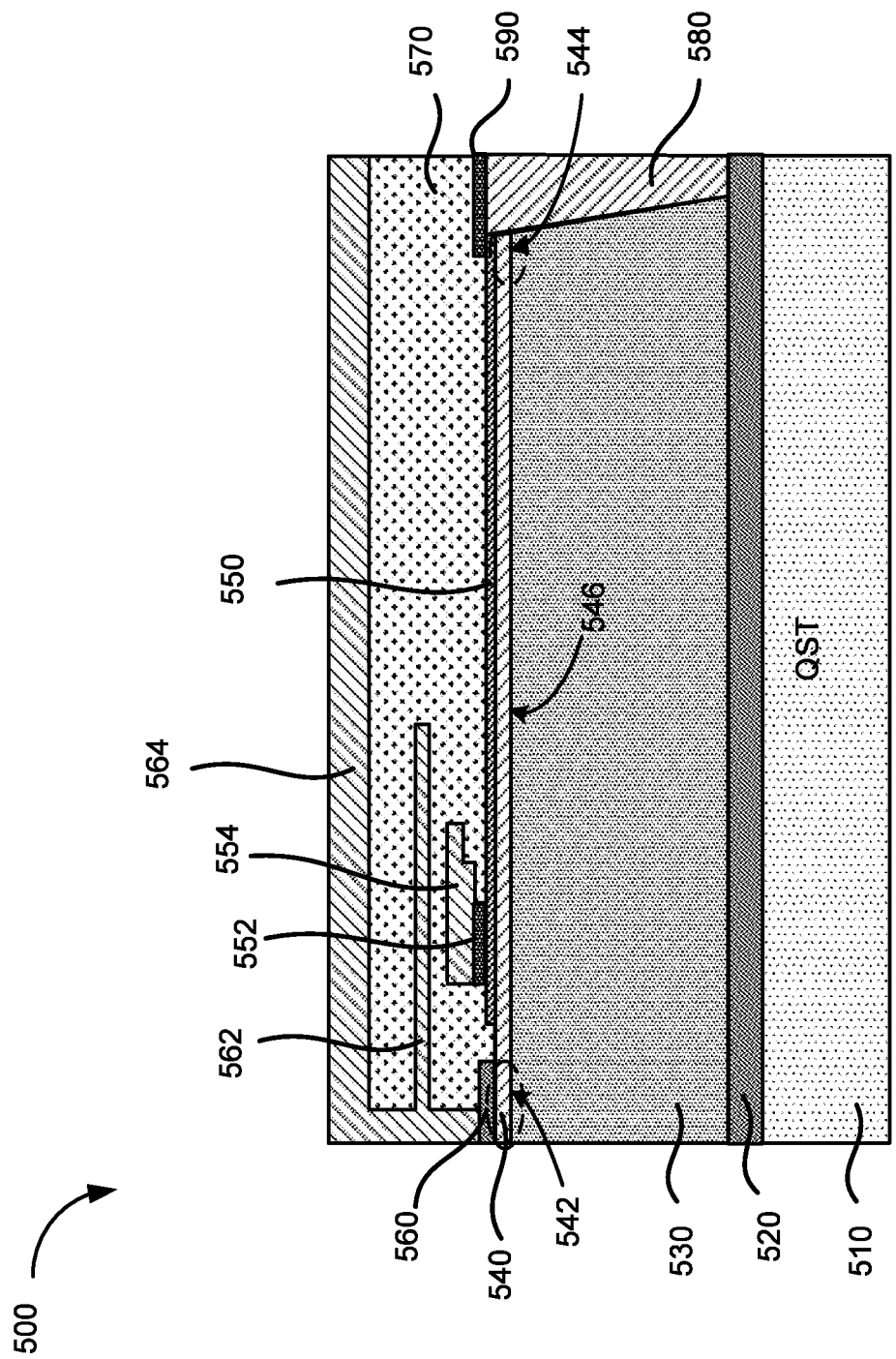
FIG. 5 shows a schematic cross-sectional diagram illustrating a lateral HEMT according to some other embodiments of the present invention.

FIG. 4 shows a simplified flowchart illustrating a method 400 of forming a lateral high electron mobility transistors (HEMT) 500 according to another embodiment of the present invention. FIG. 5 shows a schematic cross-sectional diagram illustrating the lateral HEMT 500 according to another embodiment of the present invention.

Referring to FIGS. 4 and 5, the method 400 includes, at 402, providing an engineered substrate 510. The engineered substrate 510 may include a polycrystalline ceramic core, a barrier layer encapsulating the polycrystalline ceramic core, a bonding layer coupled to the barrier layer, and a substantially single crystalline silicon layer coupled to the bonding layer, as described above.

The method 400 further includes, at 404, forming a first epitaxial N-type gallium nitride layer 520 coupled to the substantially single crystalline silicon layer. The first epitaxial N-type gallium nitride layer 520 may facilitate the formation of an ohmic contact and may have a relatively high N-type doping concentration, for example in the order of about $2\times10^{18}$ cm$^{-3}$.

The method 400 further includes, at 406, forming a second epitaxial N-type gallium nitride layer 530 coupled to the first epitaxial N-type gallium nitride layer 520. The second epitaxial N-type gallium nitride layer 530 may have a relatively low doping concentration, for example less than about $1\times10^{14}$ cm$^{-3}$. In some embodiments, the second epitaxial N-type gallium nitride layer 530 may have a thickness that is greater than about 5 µm. In some other embodiments, the second epitaxial N-type gallium nitride layer 530 may have a thickness that is greater than about 10 µm. The second epitaxial N-type gallium nitride layer 530 may be referred to as a blocking GaN layer. By using a CTE-matched engineered substrate, epitaxial growth of a relatively thick blocking GaN layer with low dislocation density may be possible.

The method 400 further includes, at 408, forming an epitaxial aluminum gallium nitride barrier layer 540 coupled to the front surface of the second epitaxial N-type gallium nitride layer 530. The epitaxial aluminum gallium nitride barrier layer 540 may serve as the channel region of the HEMT 500. The channel region has a first end 542 and a second end 544, and a central portion 546 between the first end 542 and the second end 544. In one embodiment, the epitaxial aluminum gallium nitride barrier layer 540 may include about 20% aluminum. The interface between the epitaxial gallium nitride layer 530 and the epitaxial aluminum gallium nitride barrier layer 540 (referred to as the AlGaN/GaN interface) may result in a two-dimensional electron gas (2DEG) due to polarization induced charge at the hetero-interface.

The method 400 further includes, at 410, forming a gate dielectric layer 550 coupled to the epitaxial aluminum gallium nitride barrier layer 540 in the central portion 546 of the channel region, and at 412, forming a gate contact 552 coupled to the gate dielectric layer 550. The method 400 further includes, at 414, forming a source contact 560 at the first end 542 of the channel region.

The method 400 further includes, at 416, forming a via 580 at the second end 554 of the channel region through the second epitaxial N-type gallium nitride layer 530 to expose a portion of the first epitaxial N-type gallium nitride layer 520, and at 418, filling the via 580 with a conductive material. The method 400 further includes, at 420, forming a drain contact 590 at the second end 544 of the channel region. The drain contact 590 is electrically coupled to the first epitaxial N-type gallium nitride layer 520 through the conductive material in the via 580.

Thus, in this manner, the epitaxial aluminum gallium nitride barrier layer 540, the second N-type gallium nitride layer 530, and the first N-type gallium nitride layer 520 may serve as an integrated n-i-n voltage clamp diode. According to this embodiment, there is no need to remove the engineered substrate 510. The clamp diode may be designed to break down at a voltage less than the breakdown voltage of the HEMT 500, thus protecting the HEMT 500 from damage. In some embodiments, the clamp diode may be configured to have a breakdown voltage of about 600 V.

The method 400 may further include forming one or more gate field plates (FPs) 554 coupled to the gate contact 552, and forming a source field plate (FP) 562 coupled to the source contact 560. The gate FP 562 and the source FP 562 may be fabricated from low-doped amorphous or polycrystalline silicon deposited by a suitable deposition non-epitaxial method. The method 400 may further include forming an interlayer dielectric layer (ILD) 570 over the device structure. The ILD 570 may comprise, for example, $SiN_x$. In some embodiments, the ILD 570 may have a thickness of about 50 µm. The method 400 may further include forming a source pad 564 coupled to the source contact 560 and the source FP 562 over the ILD 570, and forming an off-plane gate pad (not shown in FIG. 5).

It should be appreciated that the specific steps illustrated in FIG. 4 provide a particular method of 400 according to an embodiment of the present invention. Other sequences of steps may also be performed according to alternative embodiments. For example, alternative embodiments of the present invention may perform the steps outlined above in a different order. Moreover, the individual steps illustrated in FIG. 4 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of forming a semiconductor device, the method comprising:
   providing an engineered substrate including:
      a polycrystalline ceramic core;
      a barrier layer encapsulating the polycrystalline ceramic core;
      a bonding layer coupled to the barrier layer; and
      a substantially single crystalline silicon layer coupled to the bonding layer;
   forming a first epitaxial N-type gallium nitride layer coupled to the substantially single crystalline silicon layer, the first epitaxial N-type gallium nitride layer having a first doping concentration;

forming a second epitaxial N-type gallium nitride layer coupled to the first epitaxial N-type gallium nitride layer, the second epitaxial N-type gallium nitride layer having a second doping concentration less than the first doping concentration;

forming a channel region coupled to the second epitaxial N-type gallium nitride layer by forming an epitaxial aluminum gallium nitride barrier layer on the second epitaxial N-type gallium nitride layer, the channel region having a first end and a second end, and a central portion between the first end and the second end;

forming a gate dielectric layer coupled to the epitaxial aluminum gallium nitride barrier layer in the central portion of the channel region;

forming a gate contact coupled to the gate dielectric layer;

forming a source contact at the first end of the channel region;

forming a via through the second epitaxial N-type gallium nitride layer at the second end of the channel region to expose a portion of the first epitaxial N-type gallium nitride layer;

filling the via with a conductive material; and forming a drain contact at the second end of the channel region, the drain contact electrically coupled to the first epitaxial N-type gallium nitride layer through the conductive material in the via.

2. The method of claim 1 wherein the semiconductor device comprises a high-electron-mobility transistor (HEMT).

3. The method of claim 1 wherein the epitaxial aluminum gallium nitride barrier layer, the second epitaxial N-type gallium nitride layer, and the first epitaxial N-type gallium nitride layer form a voltage clamp diode.

4. The method of claim 1 wherein the second epitaxial N-type gallium nitride layer has a thickness greater than about 5 µm.

5. The method of claim 4 wherein the second epitaxial N-type gallium nitride layer has a thickness greater than about 10 µm.

6. The method of claim 1 further comprising:
forming one or more gate field plates coupled to the gate contact;
forming a source field plate coupled to the source contact;
forming an interlayer dielectric (ILD) layer over the epitaxial aluminum gallium nitride barrier layer and the gate dielectric layer; and
forming a source pad over the ILD layer, the source pad electrically coupled to the source contact and the source field plate.

7. The method of claim 1 wherein the polycrystalline ceramic core comprises polycrystalline aluminum gallium nitride (AlGaN).

8. The method of claim 1 wherein the substantially single crystalline silicon layer has a (111) surface orientation.

9. A lateral high-electron-mobility transistor (HEMT) comprising:
a drain pad;
an epitaxial gallium nitride layer coupled to the drain pad;
a channel region having a first end, a second end, and a central portion between the first end and the second end, the channel region comprising an epitaxial aluminum gallium nitride barrier layer coupled to the epitaxial gallium nitride layer;
a gate dielectric layer coupled to the central portion of the channel region;
a gate contact coupled to the gate dielectric layer;
a source contact disposed at the first end of the channel region;
a via disposed at the second end of the channel region; and
a drain contact coupled to the via, wherein the drain contact is electrically connected to the drain pad through the via;
wherein the epitaxial aluminum gallium nitride barrier layer, the epitaxial gallium nitride layer, and the drain contact form a voltage clamp diode.

10. The lateral HEMT of claim 9 wherein the via passes through the epitaxial gallium nitride layer.

11. The lateral HEMT of claim 9 wherein the epitaxial gallium nitride layer has a thickness that is greater than about 5 µm.

* * * * *